United States Patent [19]

Finchem et al.

[11] Patent Number: 5,143,857
[45] Date of Patent: Sep. 1, 1992

[54] METHOD OF FABRICATING AN ELECTRONIC DEVICE WITH REDUCED SUSCEPTIBLITY TO BACKGATING EFFECTS

[75] Inventors: Eric P. Finchem, Beaverton; William A. Vetanen, Sherwood; Bruce Odekirk, Hillsboro; Irene G. Beers, Tigard, all of Oreg.

[73] Assignee: TriQuint Semiconductor, Inc., Beaverton, Oreg.

[21] Appl. No.: 561,211

[22] Filed: Jul. 30, 1990

Related U.S. Application Data

[62] Division of Ser. No. 267,967, Nov. 7, 1988, abandoned.

[51] Int. Cl.⁵ .......................................... H01L 21/338
[52] U.S. Cl. .................................... 437/22; 437/175; 437/176; 437/184; 437/912; 148/DIG. 139; 148/DIG. 140
[58] Field of Search ............... 437/22, 175, 176, 184, 437/912; 357/15, 91; 148/DIG. 139, DIG. 140

[56] References Cited

U.S. PATENT DOCUMENTS

| | | | |
|---|---|---|---|
| 3,513,366 | 5/1970 | Clark | 437/912 |
| 3,923,553 | 12/1975 | Hayashi et al. | |
| 4,033,788 | 7/1977 | Hunsperger et al. | 437/184 |
| 4,080,721 | 3/1978 | Hung | 437/184 |
| 4,222,164 | 9/1980 | Triebwasser | 437/912 |
| 4,253,229 | 3/1981 | Yeh et al. | 437/912 |
| 4,304,042 | 12/1981 | Yeh | 437/912 |
| 4,342,149 | 8/1982 | Jacobs et al. | |
| 4,393,578 | 7/1983 | Cady et al. | 437/912 |
| 4,534,103 | 8/1985 | Cho et al. | 437/912 |
| 4,569,119 | 2/1986 | Terada et al. | 437/912 |
| 4,602,965 | 7/1986 | McNally | 437/912 |
| 4,636,822 | 1/1987 | Codella et al. | 437/184 |
| 4,642,259 | 2/1987 | Vetanen et al. | 437/184 |
| 4,677,735 | 7/1987 | Malhi | |
| 4,729,966 | 3/1988 | Koshino et al. | 437/912 |
| 4,782,031 | 11/1988 | Hagio et al. | 437/176 |
| 4,782,032 | 11/1988 | Geissberger et al. | 437/912 |
| 4,792,531 | 12/1988 | Kakihana | 437/912 |
| 4,799,098 | 1/1989 | Ikeda et al. | 357/23.3 |
| 4,804,635 | 2/1989 | Young | 437/912 |
| 4,843,033 | 6/1989 | Plumton et al. | 437/184 |
| 4,889,831 | 12/1989 | Ishii et al. | 437/184 |
| 4,892,835 | 1/1990 | Rabinzohn et al. | 437/184 |
| 4,924,277 | 5/1990 | Yamane et al. | 357/23.3 |
| 4,929,568 | 5/1990 | Beasom et al. | 437/176 |
| 4,948,746 | 8/1990 | Beasom | 437/912 |

FOREIGN PATENT DOCUMENTS

| | | | |
|---|---|---|---|
| 0037882 | 3/1982 | Japan | 437/912 |
| 0123779 | 7/1983 | Japan | 437/912 |
| 58-148465 | 9/1983 | Japan | 357/22 P |
| 0164951 | 9/1984 | Japan | 437/176 |
| 0308956 | 12/1988 | Japan | 437/176 |
| 0012927 | 1/1990 | Japan | 437/912 |

*Primary Examiner*—Robert Kunemund
*Assistant Examiner*—M. Wilczewski
*Attorney, Agent, or Firm*—Dellett, Smith-Hill and Bedell

[57] ABSTRACT

A method of fabricating an integrated circuit comprises providing a heavily compensated substrate having a source region, a drain region and a third region, each of a first conductivity type, and introducing dopant of a second conductivity type into the substrate to surround the third region.

15 Claims, 1 Drawing Sheet

METHOD OF FABRICATING AN ELECTRONIC DEVICE WITH REDUCED SUSCEPTIBLITY TO BACKGATING EFFECTS

This is a division of application Ser. No. 07/267,967 filed Nov. 7, 1988 and now abandoned.

BACKGROUND OF THE INVENTION

This invention relates to very large scale integrated (VLSI) circuit technology and more specifically, but not exclusively, to a method for fabricating integrated circuits (IC's) comprising metal-semiconductor field effect transistors (MESFET's).

FIG. 1 illustrates an integrated circuit comprising depletion mode n channel MESFET's 10A and 10B fabricated on a semi-insulating GaAs substrate 12. Each MESFET 10 comprises an N+source region 14 and an N+drain region 16, an N− channel 18 formed between the source and drain regions, and a source electrode 20 and a drain electrode 24 in ohmic contact with the source and drain regions respectively. A gate electrode 22 forms a rectifying junction with the channel causing an insulating depletion region to extend from the junction into the channel. Power supply 36 establishes a positive potential between the drain and source regions. When the gate potential is higher than the pinch-off voltage, electrons flow from source to drain through the channel. The MESFET shown in FIG. 1 comprises a layer 26 on the backside of channel 18. This layer has been shown to reduce short channel effects, decrease subthreshold current, increase transconductance and improve threshold voltage uniformity.

The IC shown in FIG. 1 may be fabricated by first implanting dopant, such as silicon (Si29) through a mask into the substrate 12 of semi-insulating GaAs to form the lightly doped N-type channel 18. A P-type dopant that provides shallow acceptors, such as beryllium (Be9), is implanted through the same mask to form the layer 26 on the backside of each channel. A further implantation of dopant is carried out using a mask that defines openings on either side of the channel 18 to form the N-type source and drain regions 14 and 16. In a VLSI circuit, the distance D between the MESFET'S 10A and 10B may be 3 μm or less.

An IC having a high density of devices may exhibit backgating, which results in crosstalk between devices. Backgating occurs in an n channel GaAs MESFET when an ohmic-contacted region (backgate region) spaced at a small distance from an operating FET is negatively biased with respect to the source of the FET. This backgate region may be the source or drain of a nearby N channel FET. The negative bias causes carriers to leave the backgate region, travel through the region of semi-insulating substrate that separates the backgate region from the operating FET and fill the deep traps in the substrate. As the negative bias on the backgate region increases, the depletion region in the channel widens, resulting in a reduction in drain current. When the negative bias voltage reaches a certain threshold value, at which all the deep traps in the substrate are filled (trap-fill-limited-voltage), the substrate resistance decreases sharply and therefore the substrate current rises steeply. This corresponds to an equally rapid decrease in drain current.

Crosstalk between devices due to backgating is an extremely undesirable effect in an IC, and increases as the density and complexity of IC's increases. When significant backgating occurs, FET characteristics depend not only on the internal device biases but also on the proximity of negative voltage lines. Normally straightforward design considerations, such as dc operating points and matching between devices, become layout dependent, leading to severe design complications. To reduce the effects of backgating, the backgate threshold voltage (trap-fill-limited-voltage) must be decreased (more negative).

In an IC of the kind shown in FIG. 1, the backgate threshold voltage is typically about −6 v. The dopant concentration in the layer 26 on the backside of the channel has no effect on the backgate threshold voltage.

In K. Inokuchi et al "Suppression of Sidegating Effect for High Performance GaAs IC's", IEEE GaAs IC Symposium, 117 (1987) there is described a method for suppressing the backgating effect in a GaAs MESFET by inserting a negatively biased P-type region between a FET and a backgate region. This biased P-type region may effectively decrease the backgate threshold voltage but is not easily incorporated into VLSI technology. A P-type region must be implanted between each FET and each potential backgate region. Implanting the separate P-type region adds photomasking steps to the fabrication process. Also, the typical spacing between a source and the P-type region is 10 μm. Therefore, in an IC having multiple FET's, the space between FET's must be approximately 20 μm. Such a spacing is simply too large to be feasible in a VLSI circuit. Additionally, each P-type region must be provided with an electrode in ohmic contact with the P-type region, and a negative power supply. The increase in processing complexity and in the spacing of the FET's on the IC diminishes the effectiveness of this method as applied toward VLSI technology.

In T. Shimura et al "A Buried P-Layer Lightly Doped Drain (BPLDD) Self-Aligned GaAs MESFET", Conference on Solid State Devices and Materials, pp. 387–390 (1986) there is described a method for suppressing short channel effects in a GaAs MESFET.

SUMMARY OF THE INVENTION

Gallium arsenide substrates that are at present commercially available are heavily compensated, i.e., they have numerous energy levels between the conduction band and the valence band. These energy levels exist because of the presence of impurities that cannot readily be removed during fabrication of the substrates.

A preferred embodiment of the present invention in a first aspect is a method of fabricating an integrated circuit comprising providing a heavily compensated substrate having a source region, a drain region and a third region, each of a first conductivity type, and introducing dopant of a second conductivity type into the substrate to surround the third region.

A preferred embodiment of the present invention in a second aspect is an integrated circuit comprising a heavily compensated substrate having a source region, a drain region and a third region, each of a first conductivity type, and a layer surrounding the third region and containing dopant of a second conductivity type.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE DRAWINGS

Figure 1:
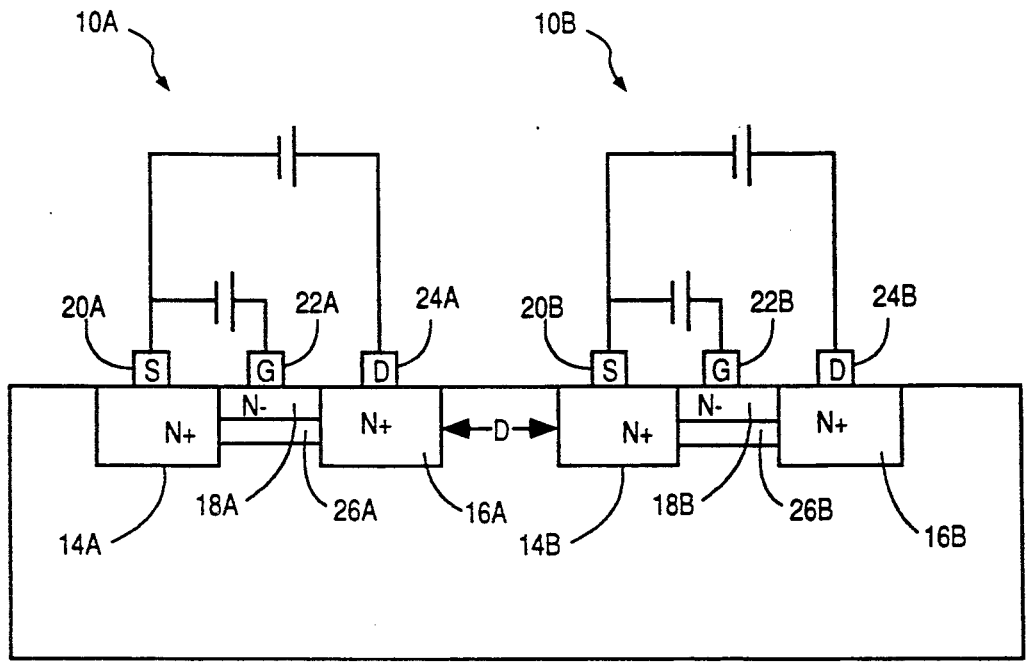
FIG. 1 illustrates a conventional GaAs integrated circuit comprising MESFET's.
Figure 2:
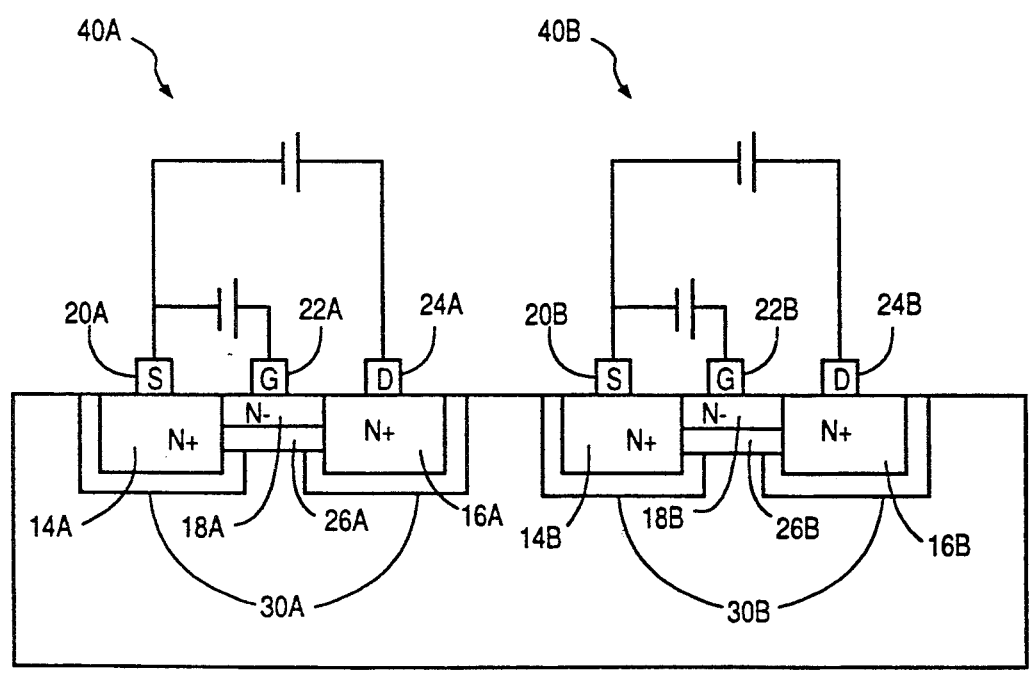
FIG. 2 illustrates a GaAs integrated circuit embodying the present invention.

The IC shown in FIG. 2 may be fabricated using essentially the same procedure as is employed to fabricate the FIG. 1 IC, except that, following the implantation of dopant such as silicon (Si29) through a mask to form the N+drain and source regions 16 and 14 of the respective MESFET's, P-type dopant providing shallow acceptors, such as beryllium (Be9), is implanted through the same mask. The beryllium penetrates farther into the substrate, thereby forming a layer 30 having an increased concentration of shallow acceptors surrounding the drain and source regions of the respective MESFET's in the IC. The energy and dosage of the beryllium implant determine the depth of penetration.

The mechanism by which electrons are kept in the N+drain and source regions is not specifically known but is believed to be due to the shallow acceptors ionizing the deep donors, such as EL2, thereby increasing the electron trap density in the layer surrounding the N+regions. Therefore, electrons injected into the substrate by the N+regions are trapped and are unable to influence nearby MESFET's. The deep donor must be neutralized, i.e., all the holes (deep traps) filled, before electrons from the source region of MESFET 40B, for example, can travel through the substrate to the channel of the MESFET 40A, so that significant backgating can occur. Since the electron trap density is increased, a larger reverse bias is required to activate enough electrons to fill the deep traps, i.e., the backgating threshold voltage is decreased. If the dose of Be9 is sufficient to create a layer of P-type material around the drain and source regions, a diode effect may also contribute to confining electrons in the drain and source regions.

It was found that with a beryllium dose of 1E12 cm$^{-2}$, the backgate threshold voltage decreased to $-16$ v at a spacing of 3 μm between FET's. As the dose of beryllium increased, the backgate threshold voltage decreased further, reaching a minimum value of $-35$ v at a dose of 4E12 cm$^{-2}$ with a spacing of 3 μm. This dose may not be sufficient to make the layer around the heavily doped N+drain and source regions P-type.

Since it is not necessary to provide an implanted region between MESFET's, it is not necessary to increase the spacing D between MESFET's beyond 3 μm. Only a single processing step is added to the fabrication of a MESFET, and no additional photomasking steps are needed, and therefore the complexity of the fabrication process is not increased significantly.

It will be appreciated that the invention is not restricted to the method and device that have been described, and that variations may be made therein without departing from the scope of the invention as defined in the appended claims and equivalents thereof. For example, the beryllium may first be implanted through a mask and then the silicon implanted through the same mask to form the drain and source regions. Also, although the described embodiment is a depletion mode device, the method also applies to enhancement mode devices. The method can be applied to devices having P, or semi-insulating channels fabricated on heavily compensated substrates. Dopant providing shallow donors may be used to surround the drain and source regions of a P channel MESFET thereby confining holes in the P-type drain and source regions. Also, the same method can be applied to reduce susceptibility of other devices, such as charge-coupled devices and PIN diodes, to backgating due to the presence of a nearby backgate region. In an IC comprising both N and P channel devices, the methods as described hereinabove may be used to implant shallow acceptors and shallow donors into the respective devices to inhibit backgating.

We claim:

1. A method of fabricating an integrated circuit, comprising:

providing a substrate having a source region, a drain region and a third region, each of N+ conductivity, the third region being spaced from the source and drain regions by a region of semi-insulating material, and the source and drain regions being spaced by a channel region of N− conductivity, introducing P-type dopant into said substrate to surround the third region, providing electrodes in ohmic contact with the source, drain and third regions respectively, and providing an electrode over the channel region.

2. A method as recited in claim 1, wherein said P-type dopant is beryllium.

3. A method as recited in claim 1, wherein the substrate is gallium arsenide.

4. A method as recited in claim 1, wherein the source and drain regions are regions of a first MESFET, and the method comprises providing a fourth region associated with the third region, the third and fourth regions being the source and drain regions of a second MESFET.

5. A method as recited in claim 1, wherein the step of providing an electrode over the channel region comprises providing a Schottky gate electrode over the channel region.

6. A method of fabricating an integrated circuit, comprising the following steps, steps (b) and (c) not necessarily being in the order stated:

(a) providing a substrate of semi-insulating material having first, second and third regions, the third region being spaced from the first and second regions by a region of semi-insulating material, (b) introducing a high concentration of N-type dopant into the first region and concurrently introducing a high concentration of N-type dopant into the second and third regions, and (c) introducing a low concentration of a P-type dopant into the substrate to surround the third region.

7. A method as recited in claim 6, further comprising the step, between steps (a) and (b), of introducing N-type dopant into said substrate to provide a channel between said first region and said second region.

8. A method as recited in claim 6, comprising, concurrently with step (c), introducing said P-type dopant into said substrate to surround said first and second regions.

9. A method as recited in claim 8, wherein said N-type dopant is introduced through a mask and said P-type dopant is introduced through the same mask.

10. A method as recited in claim 6, wherein the first and second regions are spaced by a channel region of N− conductivity, and the method further comprises the steps of:

providing electrodes in ohmic contact with the first, second and third regions respectively, and providing a Schottky gate electrode over the channel region.

11. A method of fabricating an integrated circuit including a plurality of field effect transistors comprising:
   (a) providing a substrate,
   (b) introducing N-type dopant into said substrate to provide a plurality of source regions and a plurality of drain regions associated with said source regions respectively, the source and drain regions being of N+ conductivity and each source region being spaced from the associated drain region by a channel region of N− conductivity,
   (c) introducing P-type dopant into said substrate to surround said source regions and said associated drain regions respectively,
   (d) providing electrodes in ohmic contact with the source and drain regions respectively, and
   (e) providing a Schottky gate electrode over the channel regions,
   whereby field effect transistors are formed, each field effect transistor comprising a source region, and associated drain region, and a channel region between the source region and the drain region, the field effect transistors being spaced from each other by regions of semi-insulating material.

12. A method as recited in claim 11, wherein said N-type dopant is introduced through a mask to form said source and drain regions and said P-type dopant is introduced through the same mask.

13. A method as recited in claim 11, wherein said substrate is gallium arsenide.

14. A method as recited in claim 13, wherein the N-type dopant is silicon.

15. A method as recited in claim 13, wherein the P-type dopant is beryllium.

* * * * *